(12) United States Patent
Seddighrad et al.

(10) Patent No.: US 8,502,598 B2
(45) Date of Patent: Aug. 6, 2013

(54) DIGITALLY-SCALABLE TRANSFORMER COMBINING POWER AMPLIFIER

(75) Inventors: Parmoon Seddighrad, Portland, OR (US); Hongtao Xu, Beaverton, OR (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/250,983

(22) Filed: Sep. 30, 2011

(65) Prior Publication Data

US 2013/0082772 A1    Apr. 4, 2013

(51) Int. Cl.
*H03F 1/14* (2006.01)
*H03F 3/68* (2006.01)

(52) U.S. Cl.
USPC ............ 330/51; 330/124 R; 330/195

(58) Field of Classification Search
USPC ............ 330/51, 124 R, 195, 276
See application file for complete search history.

(56) References Cited

U.S. PATENT DOCUMENTS

| | | | |
|---|---|---|---|
| 6,731,166 B1 | 5/2004 | Sabouri et al. | |
| 6,856,199 B2 * | 2/2005 | Komijani et al. | 330/276 |
| 7,425,869 B2 | 9/2008 | Aoki et al. | |
| 7,880,547 B2 | 2/2011 | Lee et al. | |
| 7,940,152 B1 | 5/2011 | Kim et al. | |

FOREIGN PATENT DOCUMENTS

| | | |
|---|---|---|
| KR | 10-2011-0100448 A | 9/2011 |
| WO | 2013048891 A1 | 4/2013 |

OTHER PUBLICATIONS

Liu et al., "Fully Integrated CMOS Power Amplifier With Efficiency Enhancement at Power Back-Off", IEEE Journal of Solid-State Circuits, vol. 43, No. 3, Mar. 2008, pp. 600-609.
International Search Report and Written Opinion received for PCT Patent Application No. PCT/US2012/056506, mailed on Mar. 4, 2013, 10 pages.

* cited by examiner

*Primary Examiner* — Steven J Mottola
(74) *Attorney, Agent, or Firm* — Carrie Boone

(57) ABSTRACT

A digitally configurable transformer that performs switched transformer combining is disclosed. The flexible transformer includes switches that are dynamically configurable to efficiently combine RF power from power amplifier cores to achieve different power levels. The disclosed transformer is efficient at a broad range of power levels, leading to high power output efficiency. The transformer may be part of any power amplifier design that uses the transformer for power combining.

18 Claims, 8 Drawing Sheets peak power
proposed transformer combining peak power
proposed transformer combining

DIGITALLY-SCALABLE TRANSFORMER COMBINING POWER AMPLIFIER

TECHNICAL FIELD

This application relates to transformers and, more particularly, to transformer combining power amplifiers.

BACKGROUND

The standards with high peak-to-average power ratio, such as WiFi, WiMAX, and LTE, require high output power while maintaining high efficiency at back-off. CMOS (complementary metal-oxide semiconductor) processes are well known for their large-scale integration and low cost. They are well suited for digital design, but do not yet achieve a high power and efficient implementation of a radio frequency (RF) power amplifier, due to low device breakdown voltage and passive components in the CMOS process.

Recently, transformer combining has been proposed for producing a higher output power amplifier. While improvements at peak power have been realized with power amplifiers that use transformer combining, efficient power output at back-off power levels remains elusive.

Thus, there is a continuing need for a solution that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a digitally configurable transformer that performs switched transformer combining is disclosed. The flexible transformer includes switches that are dynamically configurable to efficiently combine RF power from power amplifier cores to achieve different power levels. The disclosed transformer is efficient at a broad range of power levels, leading to a high average efficiency with modulated signals. The transformer may be part of any power amplifier design that uses the transformer for power combining.

This technique proposes a novel and efficient method of digitally reconfigurable transformer combining called switched transformer combining. As a result, not only is a high power output achieved but also the proposed technique is an efficient way of combining at average power, leading to a highly efficient (battery life) design across a wide power range.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Transformer combining is commonly used to enable CMOS power amplifiers to efficiently operate at higher power levels. Previous methods suggest turning off sections of transformers in the power amplifier design to maintain good efficiency at different power levels.

Figure 1:
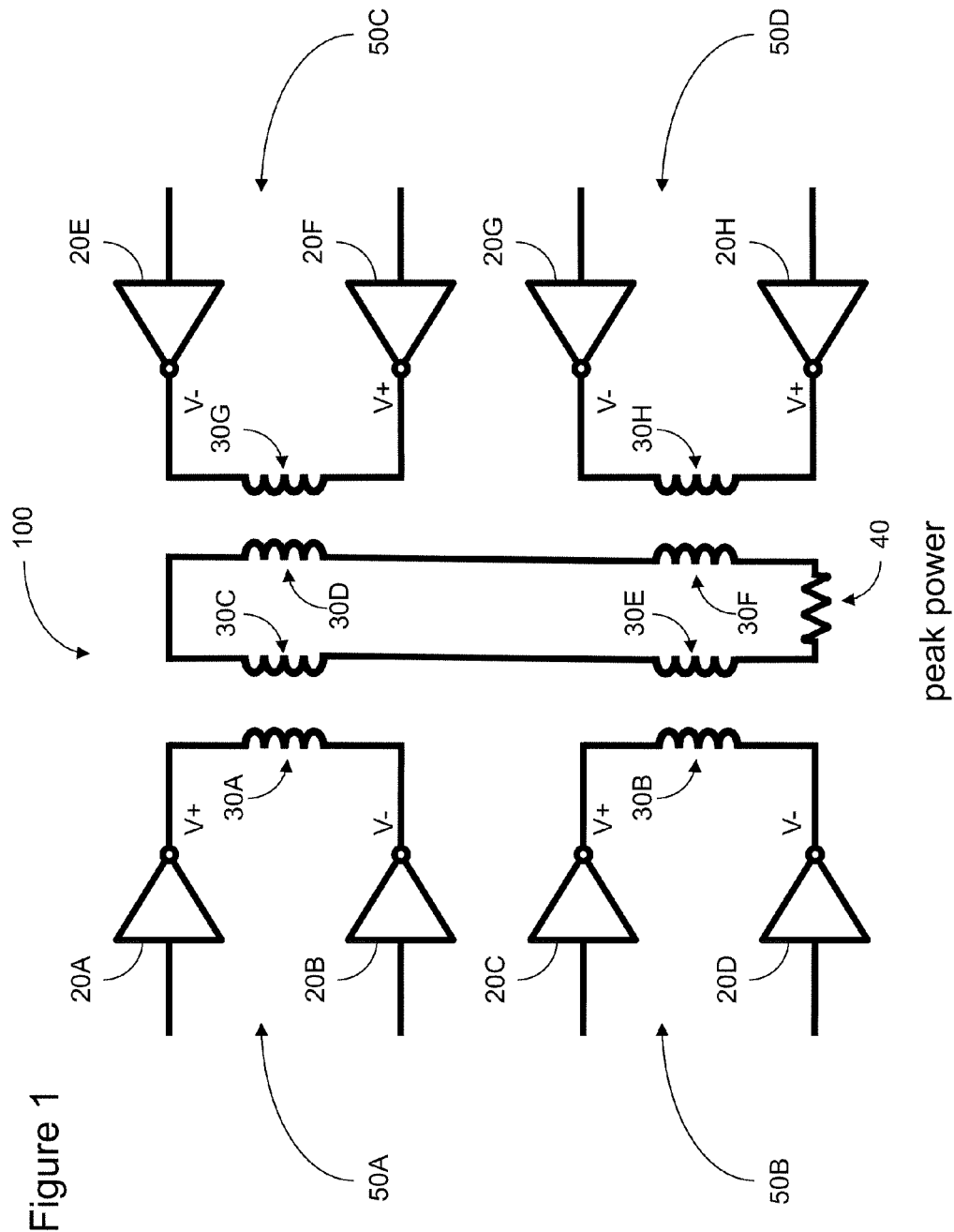
FIG. 1 is a schematic diagram of a 4-to-1 transformer combining four inverter-based switching power amplifiers, according to some embodiments.

For example, FIG. 1 is a general 4-to-1 transformer combiner 100, according to some embodiments. The transformer combiner 100 consists of four power amplifiers 50A, 50B, 50C, and 50D (collectively, "power amplifier(s) 50"), which form the primary winding (also known simply as the "primary") of the transformer. To lower the even harmonics, each power amplifier 50 is driven differentially. Each power amplifier includes a differential pair of inverters with an inductor disposed between the two inverters. Thus, the power amplifier 50A consists of two inverters 20A and 20B, with the output of each coupled to opposite sides of an inductor 30A. The power source (not shown) is connected to the input of the inverters 20A, 20B. Power amplifiers 50B, 50C, and 50D are similarly arranged. In the circuit of FIG. 1, these four power amplifiers 50 are the primary winding of the transformer 100.

The secondary winding (also known simply as the "secondary") consists of a closed circuit consisting of four inductors 30C, 30D, 30E, and 30F connected to a load (shown as a resistor 40). The inductor of each power amplifier is adjacent to one of the four inductors of the secondary winding. When all four power amplifiers are turned on, the transformer 100 is said to operate at "peak power".

To lower the output power of the transformer 100 (known herein as "back-off" or "power back-off"), in previous methods, one of the branches of the transformer would be turned off by grounding or tri-stating the power amplifiers, depending on the power amplifier architecture.

Figure 2:
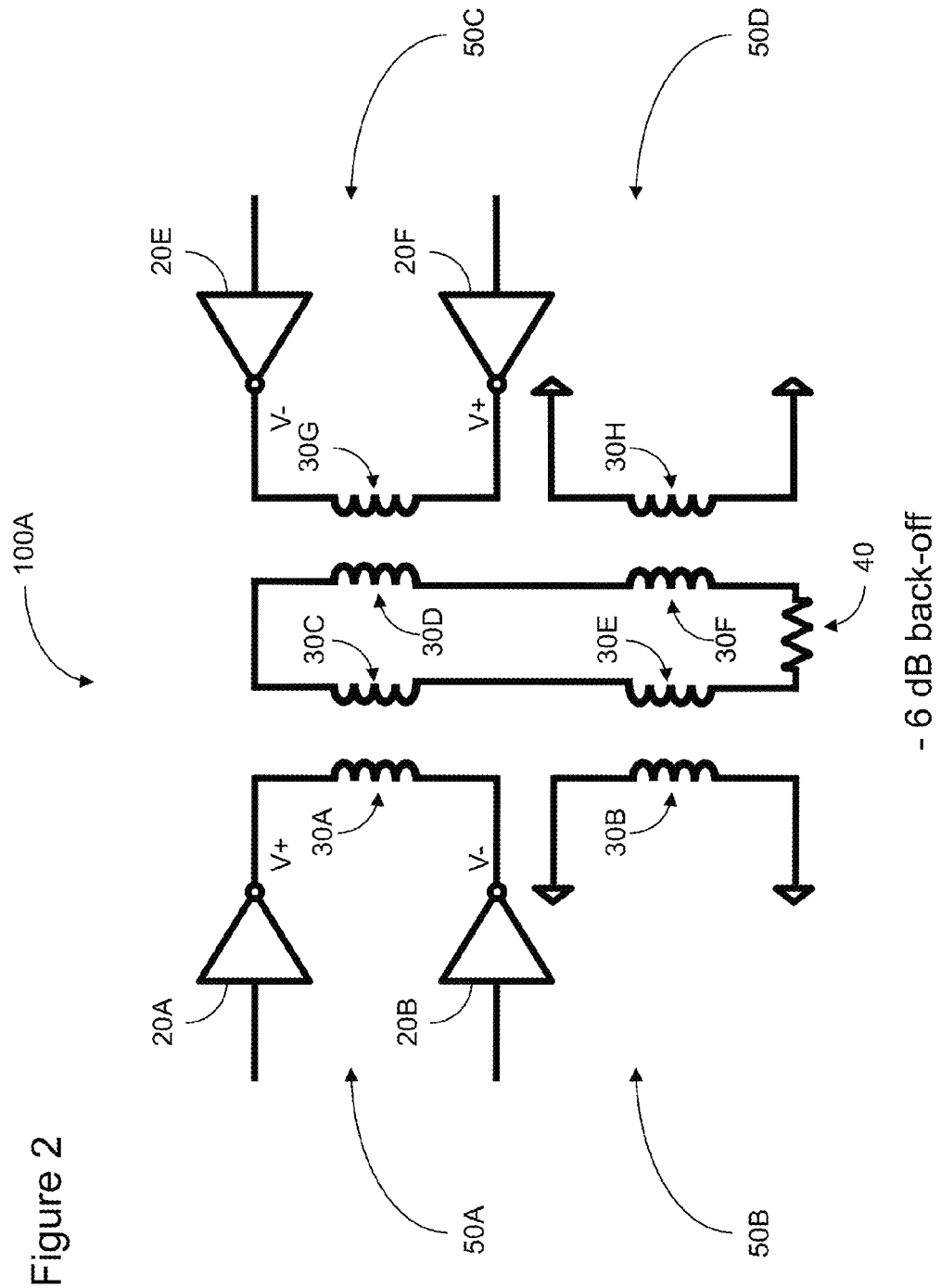
FIG. 2 is a schematic diagram of the transformer of FIG. 1, with two differential power amplifiers disabled, according to some embodiments.

FIG. 2 illustrates this method for the transformer 100 of FIG. 1, according to some embodiments. The transformer 100A now has two power amplifiers 50A, 50C, with power amplifiers 50B and 50D being turned off and grounded. The power amplifiers 50A, 50C induce a magnetic field between their respective inductors (30A for the power amplifier 50A, 30G for the power amplifier 50C), which, in turn, induces current in the secondary winding of the transformer 100A, as expected. The current in the secondary winding, in turn, induces a magnetic field between the inductors 30E and 30B (the inductor of the turned off power amplifier 50B) and between the inductors 30H and 30F (the inductor of the turned off power amplifier 50D). Therefore the inductors 30B and 30H are dissipating power due to this induced current without contributing to any output power since the power amplifiers 50B and 50D are turned off. Thus, although the output power is reduced (−6 dB), the power dissipation in these non-active primary inductors reduces the efficiency of the transformer 100A at back-off. So, while the transformer 100A operates optimally at peak power, its efficiency suffers at back-off power, reducing the usefulness of the transformer, particularly in applications where battery life is a premium consideration, such as with cellular phone technology.

Figure 3:
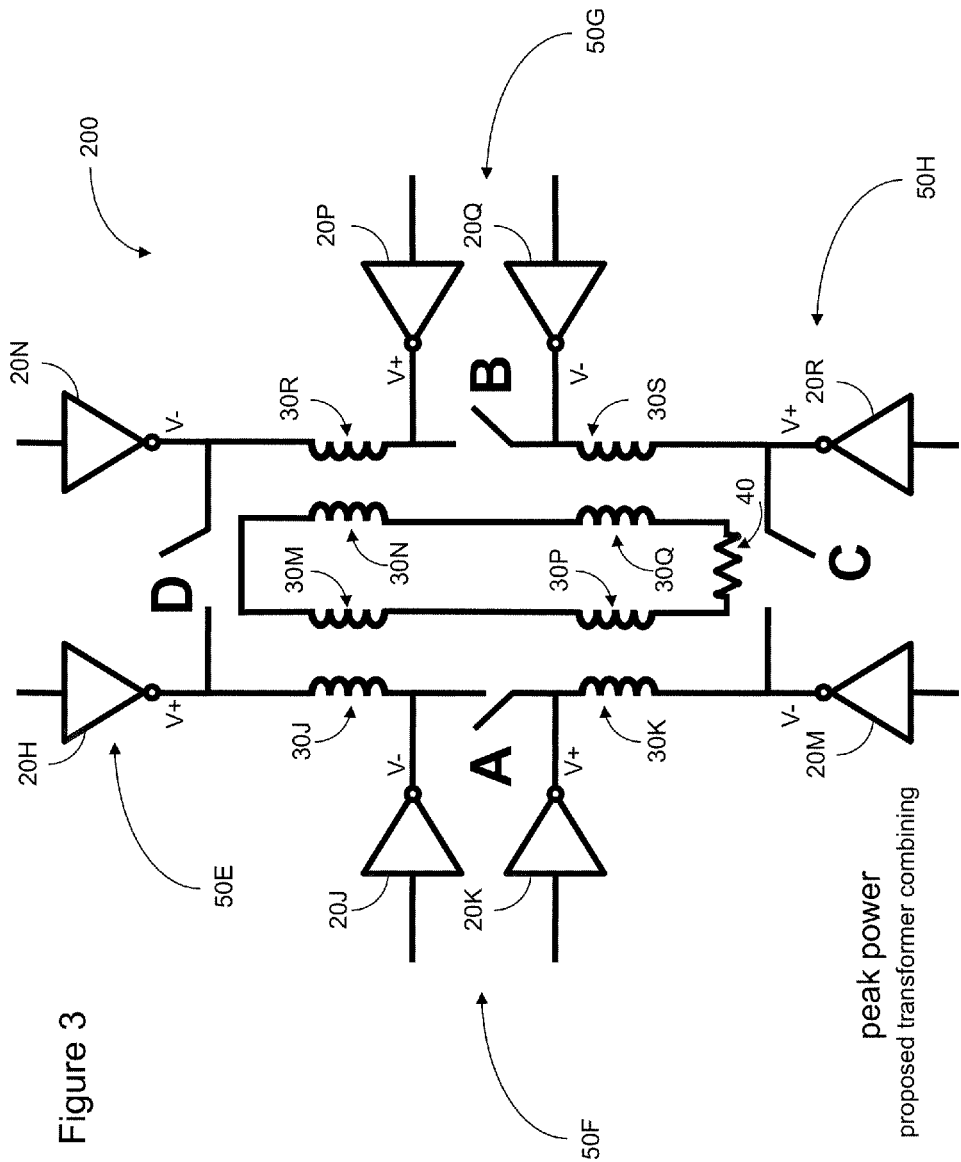
FIG. 3 is a schematic diagram of a digitally configurable transformer that performs switched combining of power amplifiers, according to some embodiments.
Figure 4:
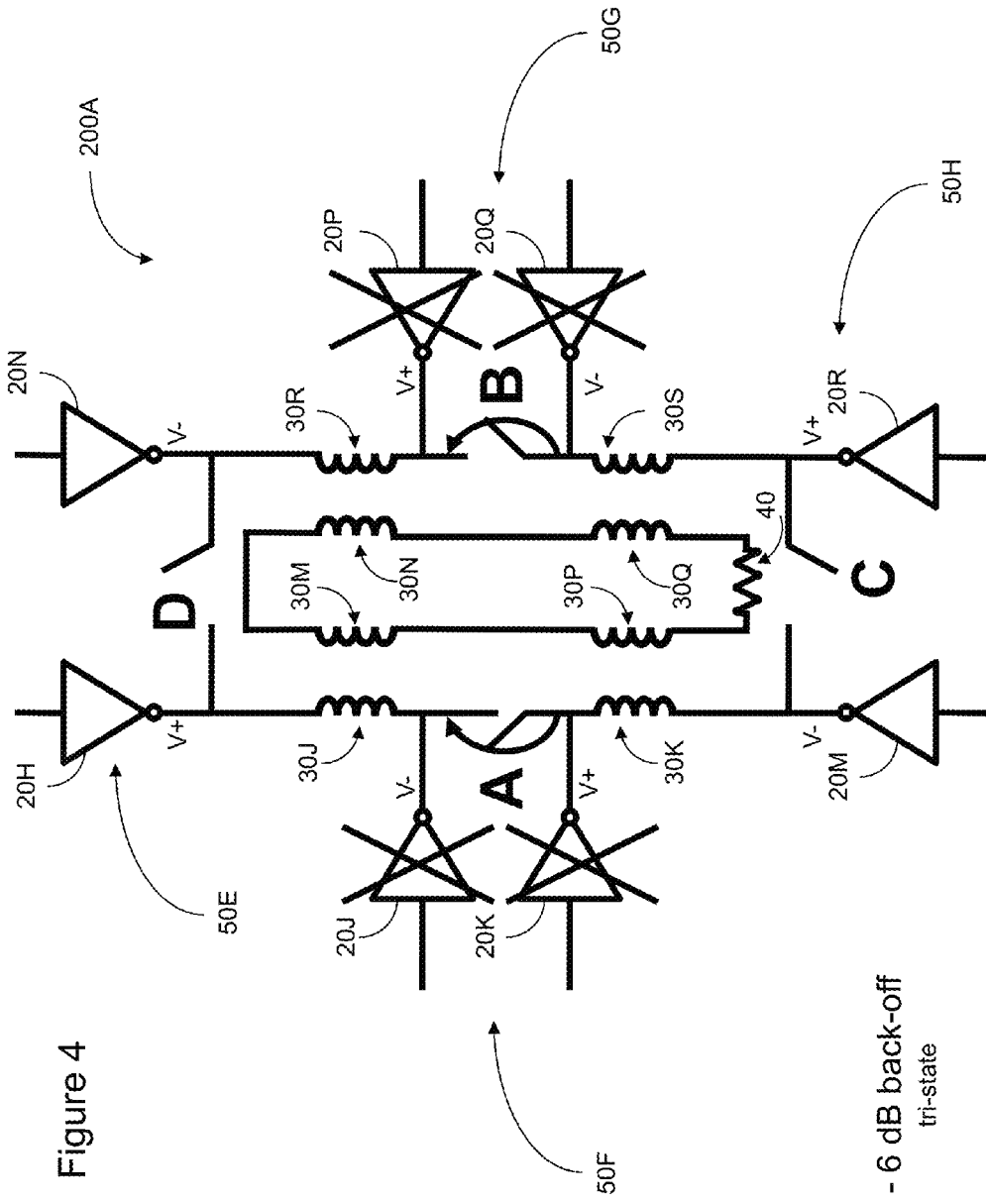
FIG. 4 is a schematic diagram of the transformer of FIG. 3, where inverters are tri-stated and switches are closed, enabling efficient −6 dB back-off, according to some embodiments.
Figure 5:
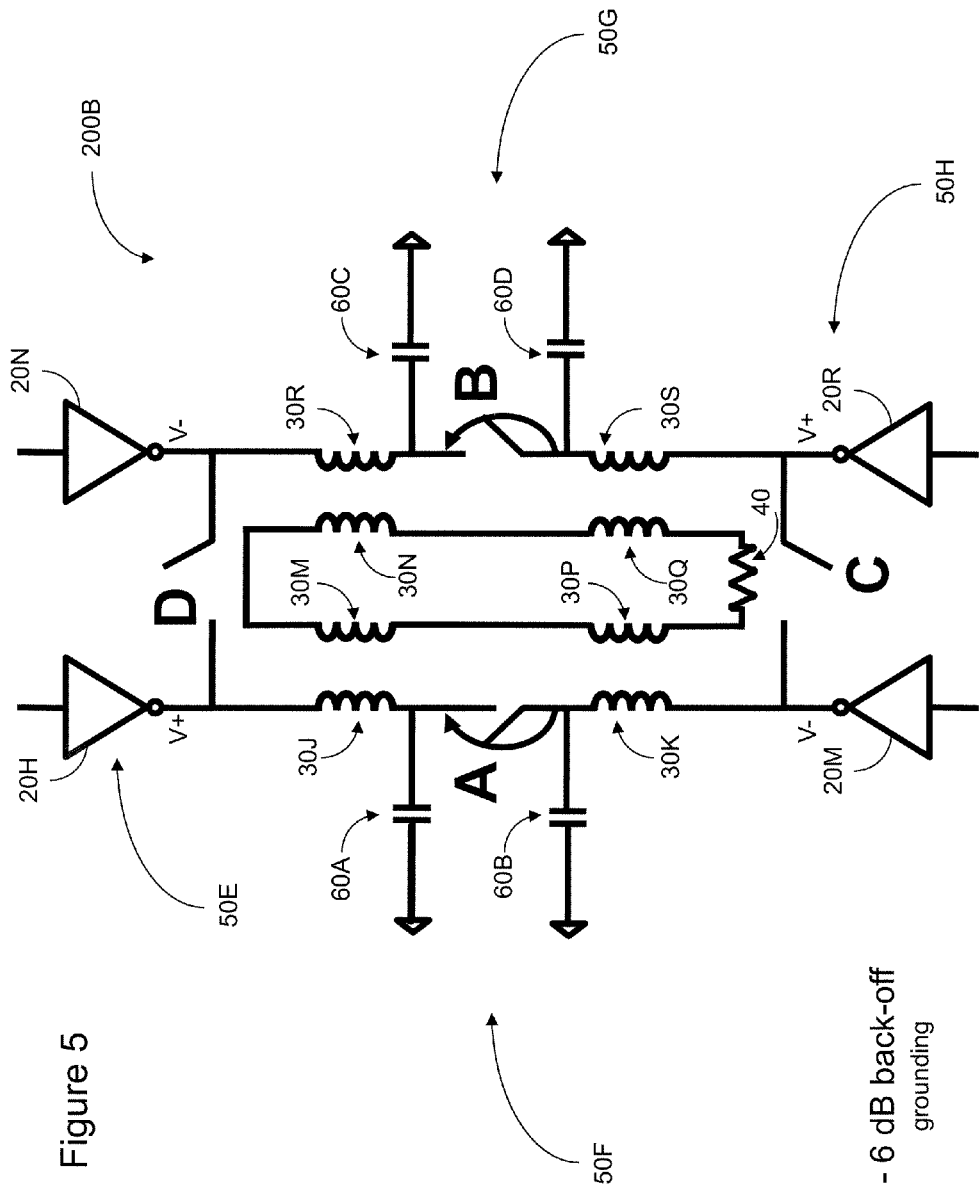
FIG. 5 is a schematic diagram of the transformer of FIG. 3, where inverters are grounded and switches are closed, enabling efficient −6 dB back-off, according to some embodiments.
Figure 6:
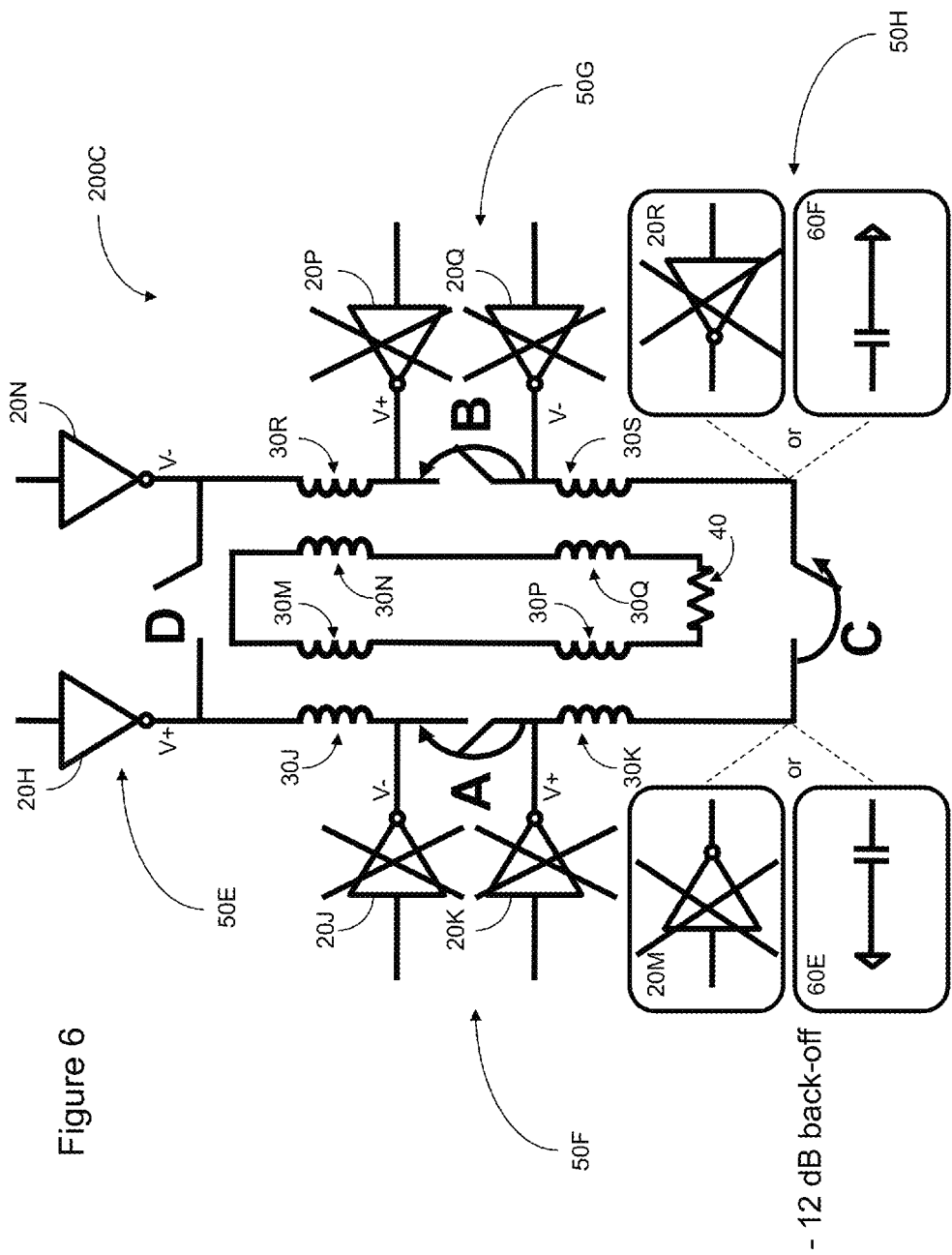
FIG. 6 is a schematic diagram of the transformer of FIG. 3, where the middle inverters are tri-stated and the bottom inverters are either tri-stated or grounded and the switches are closed, enabling efficient −12 dB back-off, according to some embodiments.

A proposed transformer design 200, as depicted in FIG. 3, resolves this inefficiency, by strategically placing switches in the design, in some embodiments. FIG. 3 depicts a transformer 200 having added circuitry to achieve power back-off while maintaining good efficiency by selectively turning off power amplifiers, according to some embodiments. FIGS. 4, 5, and 6 depict the transformer 200 in alternative states, denoted as transformer 200A, 200B, and 200C, respectively (collectively, transformer 200). In the transformer 200, switches A, B, C, and D are used to connect previously unconnected transformer terminals, such that, when turning off power amplifier sections to achieve power back-off, the power dissipation described above is avoided.

The transformer 200 of FIG. 3 includes four sets of power amplifiers in the primary winding. A first power amplifier 50E consists of inverters 20H and 20N, with a switch D disposed between the two inverters. Similarly, a second power amplifier 50F consists of inverter 20J, switch A, and inverter 20K. Power amplifier 50G consists of inverter 20P, switch B, and inverter 20Q. Finally, power amplifier 50H consists of inverter 20M, switch C, and inverter 20R. In the configuration of FIG. 3, the transformer 200 operates at peak power.

The secondary winding consists of inductors 30M, 30N, 30P, and 30Q. As with the previous transformer 100, each inductor in the secondary winding is adjacent to an inductor in the primary winding.

FIG. 4 shows what happens when two of the power amplifiers are off. In the transformer 200A, power amplifiers 50F and 50G are tri-stated, according to some embodiments. As in FIG. 3, the transformer 200 consists of four power amplifiers 50E, 50F, 50G, and 50H. To achieve a −6 dB back-off, the power amplifier 50F is turned off by tri-stating its inverters 20J and 20K and closing the switch A between them. In some embodiments, the change of states of the power amplifiers and their corresponding switches occur simultaneously. Similarly, the power amplifier 50G is turned off by simultaneously tri-stating its inverters 20P and 20Q and closing its switch B.

By shutting down two power amplifiers 50F and 50G and closing switches A and B, all the primary inductors are engaged in delivering power to the secondary, enabling higher efficiency at back-off to be achieved. Thus, the power dissipation that occurs in the transformer 100A (FIG. 2) is not experienced with the transformer 200A.

Despite disabling the power amplifier 50F by simultaneously closing the switch A and disabling the corresponding inverters 20J and 20K, the inductors 30J and 30K are engaged in delivering power to the corresponding inductors 30M and 30P in the secondary. Similarly, despite disabling the power amplifier 50G by simultaneously closing the switch B and disabling the inverters 20P and 20Q surrounding the switch, the inductors 305 and 30R deliver power to the corresponding inductors 30Q and 30N in the secondary. Thus, by reducing the number of active power amplifiers in the transformer 200A without disabling corresponding inductors, the power reduction, in this case, a reduction of −6 dB, is achieved, without the unwanted power loss observed in the transformer 100A (FIG. 2).

In some embodiments, the inactive power amplifiers of the transformer 200 may be tri-stated, as in FIG. 4, or grounded, as in FIG. 5. In either case, by turning off the power amplifiers as described herein, the electromagnetic relationships between inductors in the primary winding and those in the secondary winding are preserved.

In the conventional approach to performing power level back-off (FIG. 2), the tri-stated power amplifiers 50B and 50D do not dissipate power, at least in theory. The behavior of transformers is well established: current in the primary winding, 30A and 30G, induces a magnetic field around the inductors, causing current to flow in the secondary winding. However, the current in the secondary winding does not simply drive the load 40, it also induces a magnetic field that results in current flow back to the primary winding, 30B and 30H. This back flow of current into the primary winding is what occurred in the transformer 100A in FIG. 2, causing dissipation of power in inductors 30B and 30H. Thus, the nature of this electromagnetic behavior in the transformer demands that each section of the transformer contribute evenly. In other words, for efficient combining, the transformer does not leave any primary inductors of the transformer off-load.

Stated more generally, an open circuit in the primary results in self-inductance seen in the secondary, which disturbs the matching network, reducing the efficiency of the active power amplifiers. In the proposed transformer 200, the addition of switches A and B maintains the matching network of the power amplifier, resulting in efficient operation of the remaining active sections of the power amplifier and good back-off efficiency.

In the transformer 200B of FIG. 5, the inactive power amplifiers 50F and 50G are grounded rather than being tri-stated. The power amplifiers are considered to be turned off by grounding when they are at virtual ground points (e.g., the midpoint of differential signals). In this case, the $R_{on}$ of the grounded power amplifiers dissipates power without delivering any useful power to the load. The addition of large switches A and B reduces overall power amplifiers' $R_{on}$ by making a parallel combination of switch resistances and power amplifiers' $R_{on}$, which, in turn, reduces the power loss. For this case, in some embodiments, dc blocking capacitors are used to prevent dc current from flowing from active power amplifiers to ground. FIG. 5 shows four dc blocking capacitors 60A, 60B, 60C, and 60D, one for each turned off inverter 20J, 20K, 20P, and 20Q, respectively.

Figure 7:
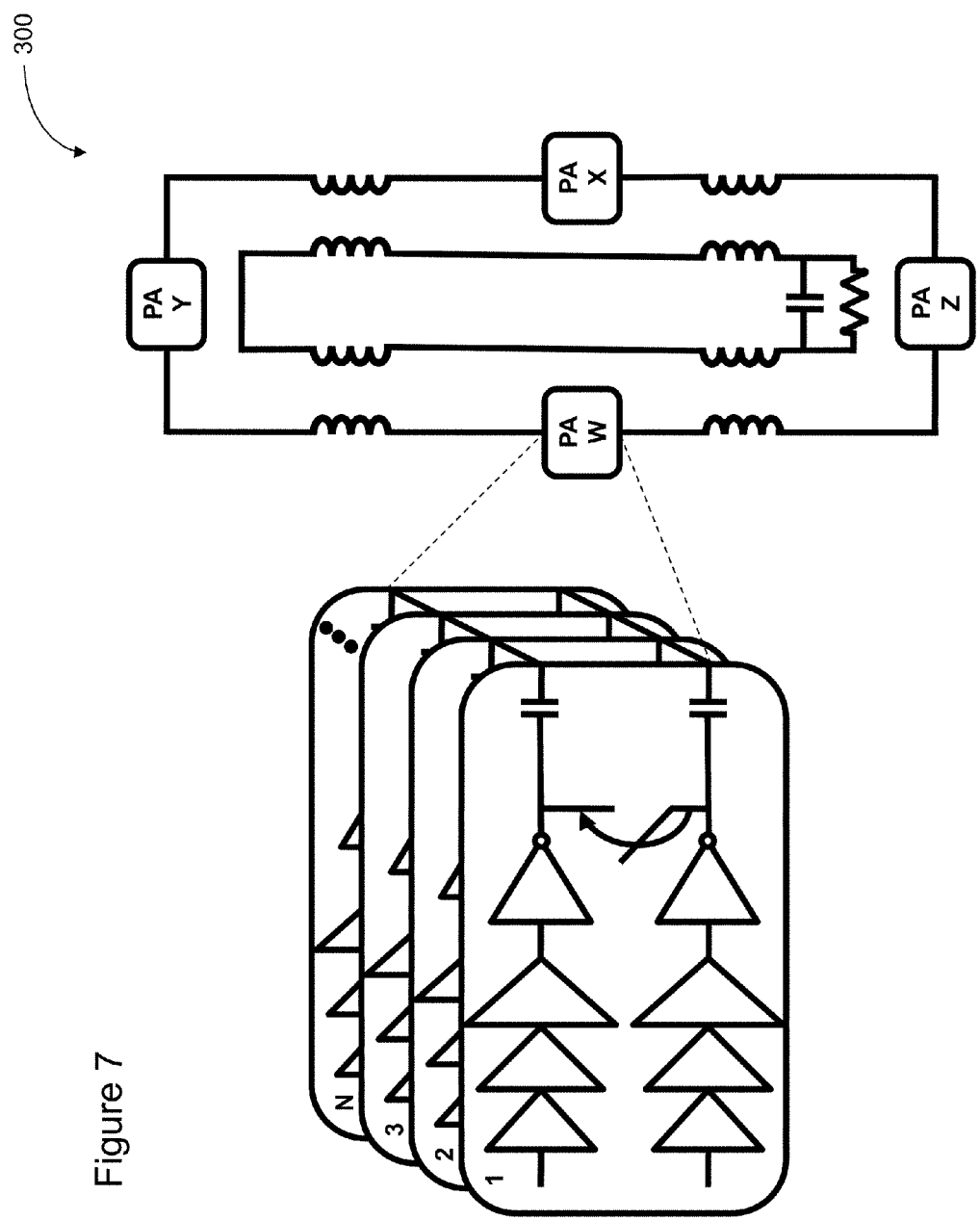
FIG. 7 is a schematic diagram of a polar power amplifier architecture, in which portions of power amplifiers are enabled or disabled in a symmetric fashion, for high power step resolution, according to some embodiments.

For turning off a power amplifier by grounding, a dc blocking capacitor such as is shown in FIGS. 5 and 6 are connected to the power amplifier output, in some embodiments. If this DC blocking cap is absorbed into the transformer design as part of the matching network, then the switch is placed directly at the power amplifier outputs, in some embodiments. FIG. 7 shows an example of this configuration.

Now, with the proper switching and, at virtually the same time, grounding or tri-stating the power amplifiers, the reconstituted power amplifiers are engaged in delivering power to the secondary without dissipating power such that higher efficiency at back-off is achieved, in some embodiments.

Another consideration of these modifications is to maintain the symmetric configuration of the transformer as power amplifiers are turned off. For example, in FIG. 4, instead of closing switches A and C to reduce the power level of the transformer 200 by 6 dB, turning off switches A and B give better efficiency. In some embodiments, this symmetric disablement of the switches enforces good differential power amplifier pair operation, which would be impaired due to non-ideal transformers and parasitic otherwise.

FIG. 6 shows the transformer 200 of FIG. 3 in a third configuration, denoted as transformer 200C, according to some embodiments. To achieve a −6 dB back-off, power amplifiers 50F and 50G are turned off (as in FIG. 4) by tri-stating inverters 20J, 20K, 20P, and 20Q and closing switches A and B. Further, to achieve −12 dB back-off, additionally, power amplifier 50H is turned off, by either tri-stating or grounding inverters 20M and 20R, and closing switch C. (While the power amplifier 50H may be tri-stated or grounded, the power amplifiers 50F and 50G are tri-stated only, in some embodiments.) The effect is to reduce a four-power amplifier configuration to a single power amplifier configuration, with power amplifier 50E delivering current to the primary winding, which passes through still-intact inductors 30J, 30K, 30R, and 30S.

At −12 dB back-off, the inverters 20J, 20K, 20P, and 20Q are tri-stated, while the inverters 20M and 20R may be either tri-stated or grounded, since the end of the primary winding is a virtual ground point and switch C is closed. Otherwise, as in FIG. 2, the RF power induced by the secondary is dissipated in the bottom two sections, which are terminated by grounding on both sides.

Although four power amplifiers are used to explain the concepts described herein, the method of switching the transformer 200 may be extended to transformers having more power amplifiers. The proposed technique may be used with any transformer-based power amplifier to achieve discrete steps of 6 dB, 12 dB, etc., while maintaining efficiency.

Further, the above operations may be combined with turning on-off smaller sections of the power amplifier to achieve an efficient switching polar operation. For example, FIG. 7 is a diagram of a polar power amplifier circuit 300, according to some embodiments. Here, each power amplifier section (W, X, Y, Z) consists of many (e.g., 16) parallel sections, denoted 1, 2, 3, . . . , N in FIG. 7, each of which may be turned on or off independently of another section. (For simplicity, only the power amplifier A is shown in detail, yet all four of the power amplifiers similarly feature multiple sections.) These subsections of the circuit may be selectively enabled and disabled to generate fine-tuned amplitude levels between −12 dB and −6 dB and between −6 dB and 0 dB from peak power as well as below −12 dB. Different combinations of transformer and power amplifier sections may be used to achieve certain desired amplitude levels.

For example, to achieve full power (0 dB) of the circuit 300, all power amplifier sections (1, 2, 3, . . . , N) are on. The output amplitude may be reduced by turning off sections in the A power amplifier only, or, alternatively, in power amplifiers W and X, and so on. So, for example, in one embodiment, the first two sections (1, 2) of power amplifier W are turned off (tri-stated/grounded) and the two first two sections of power amplifier X are also turned off (tri-stated/grounded) and their corresponding switches are closed. By symmetrically enabling and disabling parts of the circuit, the unwanted power dissipation that characterizes the circuit of FIG. 2 is avoided.

Figure 8:
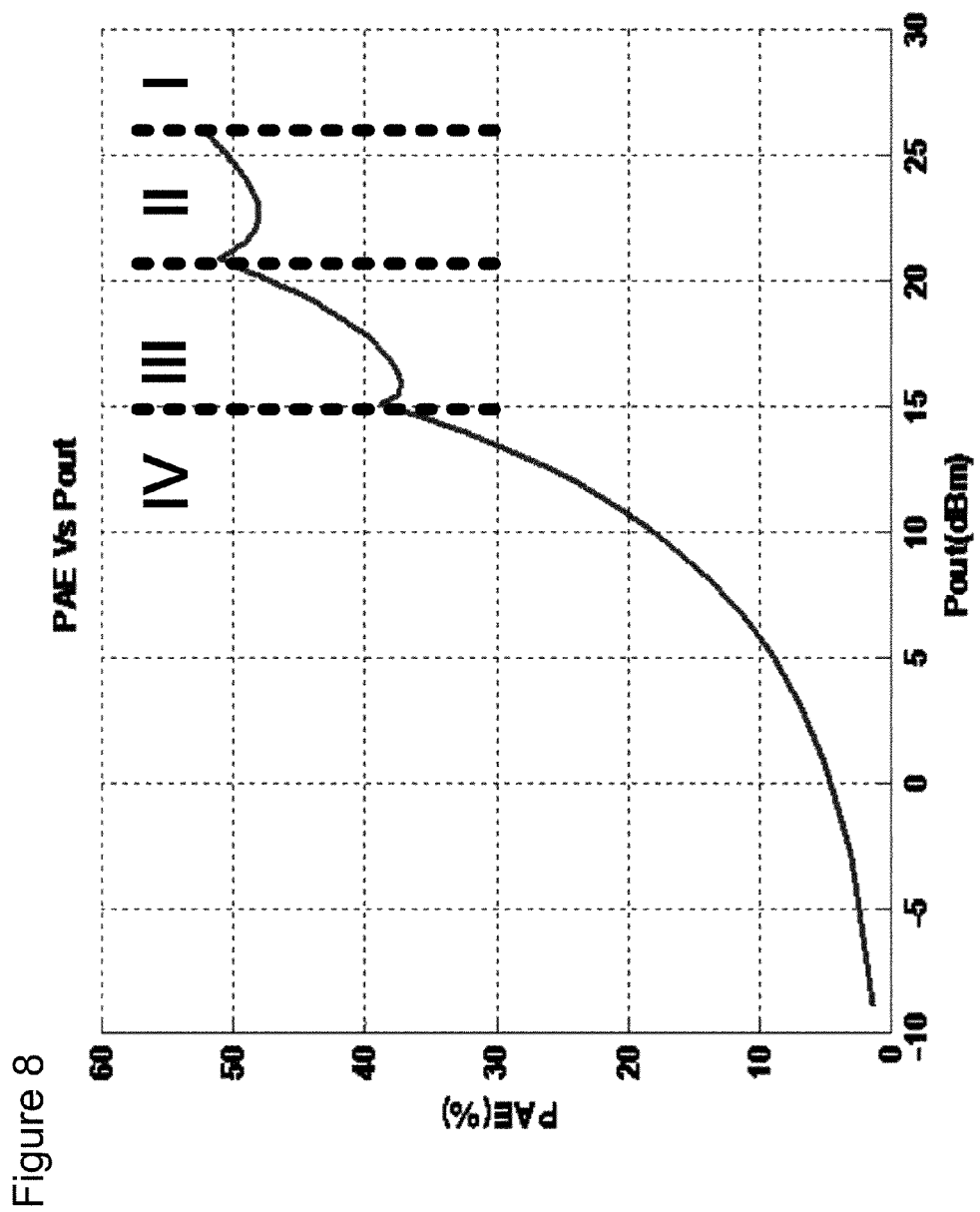
FIG. 8 is a graph plotting PAE versus $P_{out}$ for the polar power amplifier of FIG. 7, according to some embodiments.

The specific amplitude mapping used has a significant impact on achieved efficiency characteristic over power. FIG. 8 and Table 1, together, describe one of the best such mappings, according to some embodiments. The graph in FIG. 8 plots power out ($P_{out}$) versus power added efficiency (PAE). From peak power, marked as region I, (where all power amplifiers are turned on) and all the switches are open, power is reduced by alternatively turning off sections of power amplifiers W and X and then Y and Z (and closing the corresponding switches). Region II shows the power back-off from the peak power to −6 dB back-off. In this region, the power amplifiers W and X are turned off alternatively, one from each section, until all N power amplifiers are turned off by either tri-stating or grounding them and closing their corresponding switches simultaneously. At the end of this region, the W and X power amplifiers are off and their switches are closed while the Y and Z power amplifiers are on and their switches are open. Region III shows the power back-off from −6 dB to −12 dB. In this region, all power amplifiers in sections W and X are tri-stated and the corresponding switches closed, while section Y power amplifiers are turned off, one by one, and their corresponding switches closes simultaneously, until all N power amplifiers in section Y are off. Region IV shows power back-off below −12 dB. In this region, all the W and X power amplifiers are the same as in region III and all the section Y power amplifiers are either tri-stated or grounded and their corresponding switches are closed. The power amplifiers in section Z are turned off, one by one, either by grounding or tri-stating until all the N power amplifiers are off and their corresponding switches are closed.

TABLE 1

Amplitude mapping

| | I | II | III | IV |
|---|---|---|---|---|
| W | PA: N on | PA: 1→ N tri/gnd | PA: N tristated | PA: N tristated |
| | SW: N open | SW: 1 → N closes | SW: N closed | SW: N closed |
| X | PA: N on | PA: 1→ N tri/gnd | PA: N tristated | PA: N tristated |
| | SW: N open | SW: 1 → N closes | SW: N closed | SW: N closed |
| Y | PA: N on | PA: N on | PA: 1→ N tri/gnd | PA: N tri/gnd |
| | SW: N open | SW: N open | SW: 1 → N closes | SW: N closed |
| Z | PA: N on | PA: N on | PA: N on | PA: 1 → N tri/gnd |
| | SW: N open | SW: N open | SW: N open | SW: 1 → N closes |

The above techniques have been tested with both out-phasing power amplifiers and switching polar power amplifiers (FIG. 7). Both of these power amplifier architectures have similar efficiency numbers at peak, −6 dB, and −12 dB back-offs. However, their efficiency differs significantly at intermediate power levels (between −12 dB and −6 dB and between −6 dB and 0 dB). Polar switching power amplifiers have been found to give very good efficiency across power levels, as shown in FIG. 7. This technique may also be applicable to other power amplifier classes (e.g., class-AB) to achieve discrete steps of 6 dB, 12 dB, etc.

Many products use expensive external power amplifiers built on exotic processes like gallium arsenide (GaAs). On-chip power amplifiers are sometimes used, but they are usually rather inefficient, which reduces battery life and might increase package costs due to thermal considerations. Furthermore, on-chip power amplifiers are sensitive to RF modeling and require multiple spins to get them right. The above method promises a truly efficient digital power amplifier, which may be integrated.

By employing switches to disable and enable inactive sections of the transformer, the illustrated transformers (FIGS. 3-7) are characterized by significant efficiency improvements at back-off over the prior art. The switching polar implementation of FIG. 7 furthermore proposes a specific on/off mapping sequence that maintains very high efficiency across output amplitudes and with minimum distortion.

The above techniques may be implemented in transformers used in wireless transmitters for WiFi, WiMAX, LTE, etc., as well as for system-on-chip implementations.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A transformer comprising:
   a primary winding comprising:
      four power amplifiers, each power amplifier comprising a first inverter, a second inverter, and a switch coupled between the two inverters;
      four primary winding inductors, each primary winding inductor being disposed between two of the power amplifiers; and
   a secondary winding comprising:
      four secondary winding inductors, each secondary winding inductor being adjacent to one of the four primary winding inductors;
   wherein the transformer:
      operates at peak power when the four power amplifiers are turned on;
      operates at −6 dB back-off when two of the four power amplifiers are turned off; and
      operates at −12 dB back-off when three of the four power amplifiers are turned off.

2. The transformer of claim 1, wherein two power amplifiers are grounded, enabling the transformer to operate at −6 dB back-off.

3. The transformer of claim 2, further comprising:
   two direct current block capacitors disposed adjacent to two of the power amplifiers, wherein the two direct current block capacitors are active when the two turned off power amplifiers are grounded;
   wherein the first power amplifier and the second power amplifier are not adjacent to each other.

4. The transformer of claim 1, wherein two power amplifiers are tri-stated, enabling the transformer to operate at −6 dB back-off.

5. The transformer of claim 4, wherein two power amplifiers are tri-stated by:
   disabling the two inverters of a first power amplifier while simultaneously closing the switch disposed between the two inverters; and
   disabling the two inverters of a second power amplifier while simultaneously closing the switch disposed between the two inverters;
   wherein the first power amplifier and the second power amplifier are not adjacent to each other.

6. The transformer of claim 4, wherein a third power amplifier is grounded, enabling the transformer to operate at −12 dB back-off.

7. The transformer of claim 6, further comprising:
   a third direct current block capacitor disposed adjacent to the third power amplifier;
   wherein the third direct current blocking capacitor is active when the third power amplifier is grounded.

8. The transformer of claim 4, wherein a third power amplifier is tri-stated, enabling the transformer to operate at −12 dB back-off.

9. The transformer of claim 8, wherein the third power amplifier is grounded by disabling the two inverters of the third power amplifier while simultaneously closing the switch disposed between the two inverters.

10. A transformer comprising:
    a primary winding comprising a first power amplifier, a second power amplifier, a third power amplifier, and a fourth power amplifier, each power amplifier comprising a switch disposed between an inverter pair, the primary winding further comprising:
       a first inductor disposed between the first power amplifier and the second power amplifier;
       a second inductor disposed between the second power amplifier and the third power amplifier;
       a third inductor disposed between the third power amplifier and the fourth power amplifier; and
       a fourth inductor disposed between the fourth power amplifier and the first power amplifier; and
    a secondary winding comprising:
       a fifth inductor disposed adjacent to the first inductor;
       a sixth inductor disposed adjacent to the second inductor;
       a seventh inductor disposed adjacent to the third inductor;
       an eighth inductor disposed adjacent to the fourth inductor;
    wherein current induced in the primary winding is transferred to the secondary winding through the relative placement of the inductors;
    wherein the transformer:
       operates at peak power when all four power amplifiers are active;
       operates at −6 dB back-off when two power amplifiers are disabled; and
       operates at −12 dB back-off when three power amplifiers are disabled.

11. The transformer of claim 10, wherein two power amplifiers are disabled by, for each power amplifier, simultaneously tri-stating the inverter pair and closing the switch between the inverter pair;
    wherein the two power amplifiers being disabled are not adjacent to one another.

12. The transformer of claim 10, wherein two power amplifiers are disabled by, for each power amplifier, simultaneously grounding the inverter pair and closing the switch between the inverter pair;
    wherein the two power amplifiers being disabled are not adjacent to one another.

13. The transformer of claim 12, wherein two power amplifiers are disabled by, for each power amplifier:
    deactivating the inverter pair;
    activating a pair of direct current blocking capacitors located adjacent to the deactivated inverter pair; and
    simultaneously closing the switch between the deactivated inverter pair;
    wherein the two power amplifiers being disabled are not adjacent to one another.

14. The transformer of claim 10, wherein three power amplifiers are disabled by:
    tri-stating the inverter pair and simultaneously closing the switch between the tri-stated inverter pair in each of the three power amplifiers.

15. The transformer of claim 10, wherein the three power amplifiers are disabled by:
    tri-stating the inverter pair and simultaneously closing the switch between the tri-stated inverter pair in each of two power amplifiers; and
    grounding the inverter pair and simultaneously closing the switch between the grounded inverter pair in the third power amplifier.

16. The transformer of claim 15, wherein the inverter pair in the third power amplifier is grounded using direct current blocking capacitors.

17. A polar transformer comprising:

four power amplifier sections and four inductors arranged in a circular circuit, each power amplifier being disposed between an inductor, wherein the polar transformer operates at peak power when all four power amplifier sections are active and the polar transformer operates at −6 dB back-off when two of the four power amplifier sections are either tri-stated or grounded, the four power amplifier sections each comprising:

a first power amplifier sub-section comprising
first and second inverters coupled to a power source;
a switch coupled between outputs of the first and second inverters; and
two direct current blocking capacitors to block current from feeding back to the first and second inverters;

a second power amplifier sub-section comprising:
third and fourth inverters coupled to the power source;
a second switch coupled between outputs of the third and fourth inverters; and
two direct current blocking capacitors to block current from feeding back to the third and fourth inverters;

wherein the polar transformer operates at a power between peak power and −6 dB back-off when one or more of the power amplifier sub-sections in two of the four power amplifier sections is tri-stated.

18. The polar transformer of claim 17, wherein the polar amplifier operates at a power between −6 dB back-off and −12 dB back-off when one or more of the power amplifier sub-sections in a third power amplifier section of the four power amplifier sections is either tri-stated or grounded.

* * * * *